United States Patent [19]

Kobayashi

[11] Patent Number: 6,020,638

[45] Date of Patent: Feb. 1, 2000

[54] PACKAGING STRUCTURE OF BGA TYPE SEMICONDUCTOR DEVICE MOUNTED ON CIRCUIT SUBSTRATE

[75] Inventor: Yutaka Kobayashi, Tokyo, Japan

[73] Assignee: NEC Corporation, Tokyo, Japan

[21] Appl. No.: 09/103,540

[22] Filed: Jun. 24, 1998

[30] Foreign Application Priority Data

Jun. 24, 1997 [JP] Japan ..................................... 9-167520

[51] Int. Cl.⁷ .................................................. H01L 23/48
[52] U.S. Cl. .......................... 257/738; 257/737; 257/778; 257/787
[58] Field of Search .................................... 257/737, 738, 257/778, 787, 793, 693

[56] References Cited

U.S. PATENT DOCUMENTS 5,726,502  3/1998  Beddingfield ........................... 257/778
5,801,447  9/1998  Hirano et al. .......................... 257/778

*Primary Examiner*—Carl Whitehead, Jr.
*Assistant Examiner*—Roy Potto
*Attorney, Agent, or Firm*—Whitham, Curtis & Whitham

[57] ABSTRACT

A packaging structure of a semiconductor device having a BGA type package structure. The packaging structure has a circuit substrate for mounting a semiconductor device having a BGA type package structure thereon, a semiconductor device having the BGA type package structure in which BGA balls that are external terminals are electrically connected to the circuit substrate, and insulating resin charged between the circuit substrate and the semiconductor device.

7 Claims, 1 Drawing Sheet

12 BGA
14 INSULATING RESIN
11 CERAMIC WIRING BOARD

13 BGA BALLS
12 BGA
14 INSULATING RESIN
11 CERAMIC WIRING BOARD

103 BGA BALLS
102 BGA
101 CERAMIC WIRING BOARD

PACKAGING STRUCTURE OF BGA TYPE SEMICONDUCTOR DEVICE MOUNTED ON CIRCUIT SUBSTRATE

BACKGROUNDS OF THE INVENTION

1. Field of the Invention

The present invention relates to a packaging structure of a semiconductor device having a BGA (Ball Grid Array) type package structure (hereinafter, referred to as a BGA type semiconductor device) mounted on a circuit substrate such as a ceramic wiring board or the like and a packaging method of packaging the BGA type semiconductor device on the circuit substrate. More specifically, it relates to a packaging structure of a BGA type semiconductor device and its packaging method capable of assuring high stability against temperature of the circuit substrate after the semiconductor device is packaged.

2. Description of the Related Art

FIG. 3 is a cross-sectional view of a circuit substrate for use in describing the conventional packaging method of a BGA type semiconductor device. With reference to FIG. 3, a BGA type semiconductor device 102 is mounted on a ceramic wiring board 101 as a circuit substrate, and BGA balls 103 that are external terminals of the semiconductor device 102 are electrically connected to an electrode pad (not illustrated) on the ceramic wiring board by use of fixing means such as solder or the like.

However, when packaging a BGA type semiconductor device on a ceramic wiring board by use of fixing means such as solder, a great difference in the coefficient of thermal expansion between the semiconductor device and the ceramic wiring board may cause a distortion on the connection portion of the semiconductor device and the ceramic wiring board, depending on the temperature (heat cycle) after packaging the semiconductor device on the ceramic wiring board, hence producing a local stress on some part of the connected portion of the BGA balls, with some fear of destruction of the balls. Therefore, the above-mentioned packaging method cannot give a high stability to the connection of a semiconductor device and a ceramic wiring board.

For example, when a thermal shock cycle test at the cycle of −40° C. (30 min), room temperature (5 min), 125° C. (30 min) was performed there after packaging a BGA type semiconductor on a ceramic wiring board, a break occurred within 20 cycles due to a difference in the coefficient of thermal expansion of the semiconductor device and the ceramic wiring board.

SUMMARY OF THE INVENTION

In order to solve the above conventional problem, an object of the present invention is to provide a packaging structure of a semiconductor device having a BGA type package structure and its packaging method improved in stability of connection under condition that it is mounted on a ceramic wiring board, by preventing BGA balls from being destroyed due to a stress caused by a difference in the coefficient of thermal expansion between the semiconductor device and the circuit substrate.

According to one aspect of the invention, a packaging structure of a semiconductor device having a BGA type package structure, mounted on a circuit substrate, comprises a circuit substrate for mounting a semiconductor device having the BGA type package structure thereon, a semiconductor device having the BGA type package structure in which BGA balls that are external terminals are provided and the BGA balls are electrically connected to the circuit substrate, and insulating material charged between the circuit substrate and the semiconductor device.

In the preferred construction, the insulating material is made of epoxy resin.

In the preferred construction, the circuit substrate is a ceramic wiring board.

In another preferred construction, the insulating material is made of epoxy resin, and the circuit substrate is a ceramic wiring board.

According to another aspect of the invention, a packaging method for packaging a semiconductor device having a BGA type package structure on a circuit substrate, comprising the steps of a step of mounting a semiconductor device having a BGA type package structure on the circuit substrate and electrically connecting BGA balls that are external terminals of the semiconductor device to an electrode pad on the circuit substrate, and a step of flowing insulating material between the semiconductor device and the circuit substrate.

In the above-mentioned construction, in the step of flowing the insulating material, heating the semiconductor device and the ceramic wiring board, charging properly the insulating material packed in a cylinder around the semiconductor device, and after the melted insulating material flows into between the semiconductor device and the circuit substrate, cooling the semiconductor device and the ceramic wiring board so as to harden the insulating material.

Preferably, in the step of flowing the insulating material, heating the semiconductor device and the ceramic wiring board at 50° C. to 60° C., charging properly charged epoxy resin packed in a cylinder as the insulating material around the semiconductor device, and after the melted insulating material flows into between the semiconductor device and the circuit substrate, and cooling the semiconductor device and the ceramic wiring board so as to harden the insulating material.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken as limiting to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessarily obscure the present invention.

Figure 1:
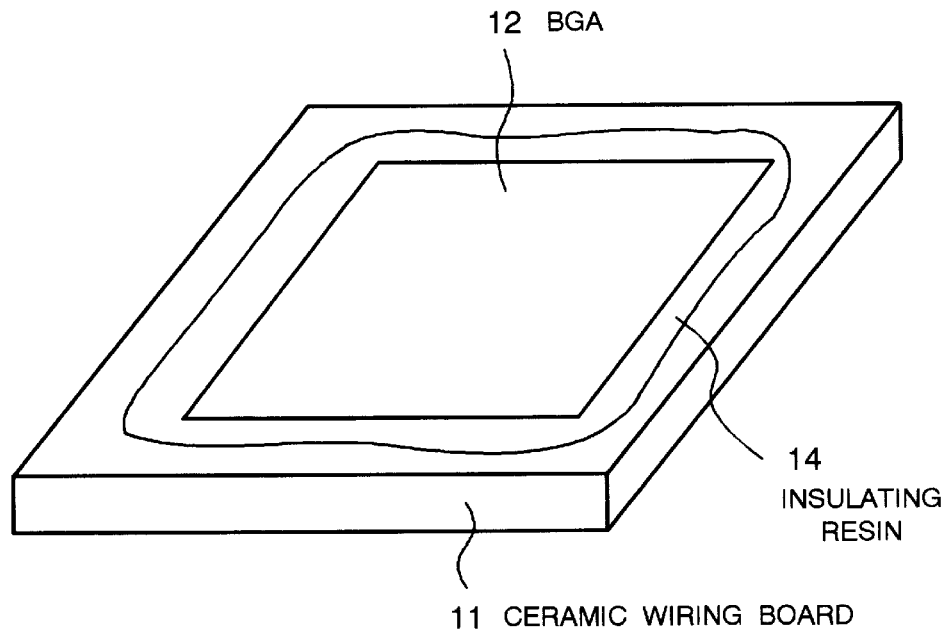
FIG. 1 is a perspective view showing the state in which a semiconductor device having a BGA type package structure is packaged on a ceramic wiring board according to an embodiment of the present invention.
Figure 2:
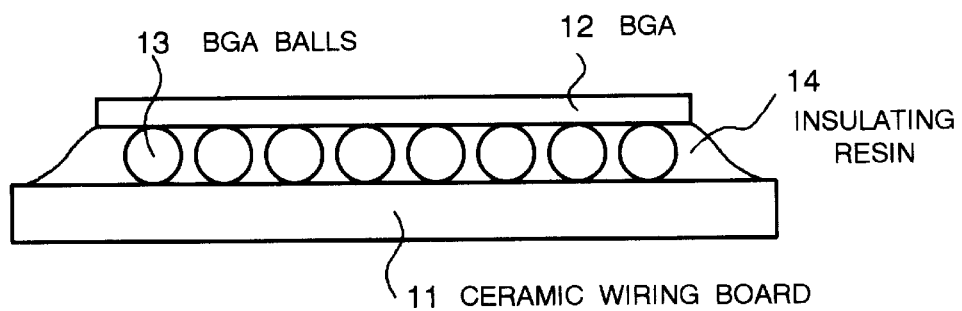
FIG. 2 is a cross-sectional view showing the packaging state of the semiconductor device shown in FIG. 1.
Figure 3:
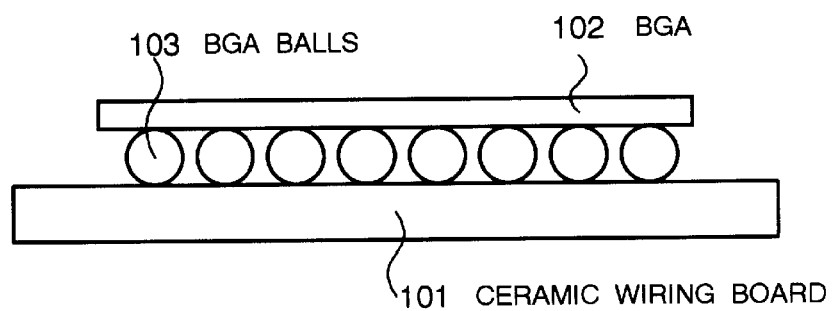
FIG. 3 is a cross-sectional view for use in describing the conventional packaging method of a semiconductor device having a BGA type package structure.

FIG. 1 is a perspective view showing the state in which a semiconductor device having a BGA type package structure is packaged on a ceramic wiring board according to an embodiment of the present invention. FIG. 2 is a cross-sectional view showing the packaging state of the semiconductor device shown in FIG. 1. With reference to FIGS. 1 and 2, a BGA type semiconductor device 12 is mounted on a ceramic wiring board 11 that is a circuit substrate, BGA balls 13 that are external terminals of the semiconductor device 12 are electrically connected to an electrode pad (not illustrated) on the ceramic wiring board 11 by use of fixing means such as solder or the like, and insulating resin 14 is charged between the semiconductor device 12 and the ceramic wiring board 11 as an insulating material that seals around the BGA balls between the semiconductor device 12 and the ceramic wiring board 11. FIGS. 1 and 2 show only the characteristic components of the embodiment and the description of the other general components are omitted.

As the insulating resin 14, various resin such as an epoxy resin or the like can be used. As illustrated in FIG. 2, the insulating resin 14 is fully charged around the BGA balls 13, which makes it possible to disperse stresses caused by the distortion in the insulating resin 14, even if a distortion occurs with the temperature (heat cycle) in the connection portion of the semiconductor device 12 and the ceramic wiring board 11. Therefore, it is possible to prevent stresses from concentrating on some part of the BGA balls 13.

The procedure of flowing the insulating resin 14 between the semiconductor device 12 and the ceramic wiring board 11 is as follows. Similarly to the conventional method, the BGA type semiconductor device 12 is first packaged on the ceramic wiring board 11 by fixing means such as solder or the like. Next, after heating the BGA type semiconductor device 12 and the ceramic wiring board 11, the insulating resin 14 packed in a cylinder is put on one side or two sides of the BGA type semiconductor device 12. The reason for heating the semiconductor device 12 and the ceramic wiring board 11 is to make the insulating resin 14 easily penetrate into the bottom surface of the semiconductor device 12 by decreasing the viscosity of the insulating resin 14. The heating temperature of the semiconductor device 12 and the ceramic wiring board 11 is set as the melting temperature of the insulating resin 14, which depends on the type of the insulating resin 14. For example, when using epoxy resin, the heating temperature is from about 50° C. to 60° C.

Under this condition, the temperature of the semiconductor device 12 and the ceramic wiring board 11 is lowered to harden the insulating resin 14 after the melted insulating resin 14 has completely flowed around the BGA balls 13 between the semiconductor device 12 and the ceramic wiring board 11.

As mentioned above, when the insulating resin 14 was charged between the BGA type semiconductor device 12 and the ceramic wiring board 11 and the thermal shock cycle test at the cycle of −40° C. (30 min), room temperature (5 min), 125° C. (30 min) was performed there, a break didn't occur until 400 cycles. Apparently, the embodiment can dramatically improve the connection stability compared with the conventional packaging method in which a break occurred within 20 cycles in the similar thermal shock cycle test.

As set forth hereinabove, the packaging structure of a semiconductor device having a BGA type package structure and its packaging method according to the present invention, in which insulating resin is charged between the BGA type semiconductor device and a ceramic wiring board, to seal up there, can prevent from concentrating the stresses on some part of the BGA balls, even if stresses occur with the temperature due to a difference in the coefficient of thermal expansion of the semiconductor device and the ceramic wiring board, because the stresses are dispersed by the insulating resin charged around the BGA balls. Therefore, it can prevent from destroying the BGA balls, thereby improving the stability of electrical connection of the semiconductor device and the ceramic wiring board.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A packaging structure of a semiconductor device having a BGA type package structure, mounted on a circuit substrate, comprising:

a circuit substrate;

a semiconductor device having a BGA type package structure with BGA balls uniformly distributed across a surface of said semiconductor device that are external terminals, said BGA balls directly contacting facing surfaces of said semiconductor device and said circuit substrate, and electrically connecting said circuit substrate to said semiconductor device; and insulating material charged between said circuit substrate and said semiconductor device, whereby said insulating material prevents a concentration of stresses on portions of said BGA balls caused by a distortion in the insulating material due to thermal stress.

2. A packaging structure of a semiconductor device having a BGA type package structure as set forth in claim 1, wherein said insulating material is made of epoxy resin.

3. A packaging structure of a semiconductor device having a BGA type package structure as set forth in claim 1, wherein said circuit substrate is a ceramic wiring board.

4. A packaging structure according to claim 1, wherein a spaced apart distance between the facing surfaces of said substrate and said semiconductor device are substantially equal to a diameter of said BGA balls.

5. A packaging structure according to claim 4, wherein said insulating material has a thickness substantially equal to a diameter of said BGA balls.

6. A packaging structure according to claim 1, wherein said insulating material has a thickness substantially equal to a diameter of said BGA balls.

7. A packaging structure according to claim 1, wherein said BGA balls are substantially equally spaced apart along an entire length of said semiconductor device.

* * * * *